United States Patent [19]

Atsumi et al.

[11] Patent Number: 4,956,816
[45] Date of Patent: Sep. 11, 1990

[54] NON-VOLATILE SEMICONDUCTOR MEMORY HAVING IMPROVED TESTING CIRCUITRY

[75] Inventors: Shigeru Atsumi; Sumio Tanaka, both of Tokyo; Shinji Saito; Nobuaki Otsuka, both of Yokohama, all of Japan

[73] Assignee: Kabushiki Kaisha Toshiba, Kanagawa, Japan

[21] Appl. No.: 358,482

[22] Filed: May 30, 1989

Related U.S. Application Data

[63] Continuation of Ser. No. 29,763, Mar. 24, 1987, abandoned.

[30] Foreign Application Priority Data

Mar. 31, 1986 [JP] Japan .................................. 61-71143

[51] Int. Cl.$^5$ ............................................. G11C 29/00
[52] U.S. Cl. ..................................... 365/201; 365/210; 365/185; 365/189.09
[58] Field of Search .................. 365/94, 104, 129, 184, 365/185, 182, 201, 226, 189.03, 230.06, 238.5, 189.09, 210; 371/15, 21

[56] References Cited

U.S. PATENT DOCUMENTS

| | | | |
|---|---|---|---|
| 4,301,535 | 11/1981 | McKenny et al. | 365/185 |
| 4,467,457 | 8/1984 | Iwahashi et al. | 365/185 |
| 4,543,647 | 9/1985 | Yoshida | 365/201 |
| 4,651,304 | 3/1987 | Takata | 365/201 |
| 4,779,272 | 10/1988 | Kohda et al. | 365/201 |
| 4,802,166 | 1/1989 | Casagrande et al. | 365/201 |

OTHER PUBLICATIONS

Atsumi et al., "Fast Programmable 256K Read Only Memory with On-Chip Test Circuits", IEEE Journal of Solid State Circuits, vol. SC-20, No. 1, Feb. 1985, pp. 422-427.

Primary Examiner—Glenn Gossage
Attorney, Agent, or Firm—Finnegan, Henderson, Farabow, Garrett and Dunner

[57] ABSTRACT

This invention provides a non-volatile semiconductor memory having a first node and a second node, the second node having a ground potential. The invention includes a plurality of non-volatile memory cells each having a drain and a threshold potential, the cells, for storing data written into the cells at a predetermined normal writing voltage. A plurality of bit lines, each memory cell being connected to one of the bit lines, transfer data to and from the memory cells. A circuit connected to the bit lines simultaneously tests the memory cells of all the bit lines at the normal writing voltage to detect changes in the threshold potential.

3 Claims, 3 Drawing Sheets

NON-VOLATILE SEMICONDUCTOR MEMORY HAVING IMPROVED TESTING CIRCUITRY

This application is a continuation of application Ser. No. 07/029,763, filed Mar. 24, 1987, now abandoned.

BACKGROUND OF THE INVENTION

1. Field of the Invention

The invention relates to a non-volatile semiconductor memory. In particular, it relates to an improved non-volatile semiconductor which uses non-volatile transistors as memory cells and in which a function to test the data-holding characteristic of the memory cells is provided.

2. Description of the Related Art

Read only memories in which it is possible to erase the data by ultra violet light and then to rewrite data are well-known as EPROM. FIG. 1 is a cross-section of the outline construction of a non-volatile transistor which is used as a memory cell in such an EPROM. In the case of this transistor being, for instance, an N-channel transistor, a source 42 and a drain 43 formed of N+ diffusion regions are provided on the surface of a P-type semiconductor substrate 41. On channel region 44 between source 42 and drain 43, a floating gate 46 is provided via an insulating film 45. Then, a control gate 48 is provided on top of floating gate 46 via an insulating film 47.

In this kind of memory cell, when writing data, a high potential is applied to drain 43 and control gate 48. Source 42 is fixed at ground potential. When a high potential is applied, channel hot electrons are generated by the high electric field in the drain vicinity of channel region 44. These electrons are injected into floating gate 46 by the electric field due to the high potential applied to control gate 48, and thus data is written.

As a result of the injection of electrons, the potential of floating gate 46 drops and a conducting channel cannot be formed in channel region 44 unless a higher potential than that before writing is applied to control gate 48. That is to say, the threshold voltage Vth of the memory cell viewed from control gate 48 (hereafter Vthcell) rises and sometimes reaches source potential Vcc after writing. As a result, when reading data, different conditions are generated in the selected memory cell. For example the current flow may be large or small, or the current may flow or not flow, according to whether data has been written or not. The memory is designed so that a "1" or "0" data level may be determined by detecting these cell current differences. The amount of shift of Vthcell is reflected in Vccmax. This Vccmax is the highest power source voltage below a certain threshold voltage at which it can be judged that the memory cell data is "0" level. Thus the higher Vthcell is, the higher Vccmax.

FIG. 2 is a circuit diagram showing the composition of a memory using memory cells constructed as in FIG. 1. Here, in order to simplify the explanation, only four memory cells, M1 to M4, are shown. In the Figure, symbols WL1 and WL2 are word-lines, symbols BL1 and BL2 are bit-lines, numerals 51 and 52 are bit-line selector transistors, numeral 53 is a row decoder for selecting WL1 and WL2, and numeral 54 is a column decoder for selecting bit-line selector transistors 51 and 52. "Data write" transistor 55 is connected to one end of each of bit-line selector transistors 51 and 52. Incidentally, although this is not illustrated in the Figure, a "read" load circuit, which is used when data is read normally, is also connected to the above-mentioned ends of bit-line selector transistors 51 and 52.

In this kind of memory, while the four memory cells M1 to M4 may not be selected individually, a high potential may be applied to their control gates or drains. That is to say, in the state when just one memory cell M1 is selected, word-line WL1 and bit line BL1 are each at high potential. At this time, although memory cells M2 and M3 are unselected, a high potential is applied to the drain of M3 and to the control gate of M2.

In this kind of memory, such memory cells as M3, to whose drain high potentials is applied, become a problem. When the number of memory cells connected to one bit-line is N, the state of this memory cell M3 can occur (N−1) memory cells. What quite frequently becomes a problem when assessing the reliability of an EPROM is the data-holding characteristic when a potential stress is applied to the drain of a memory cell.

In an EPROM, there is an after oxidation film formation process during the memory cell construction process. This after-oxidation film formation process is as follows. In a memory cell such as that shown in FIG. 1, after the formation of a gate structure composed of floating gate 46 and control gate 48, source 42 and drain 43 are formed by diffusion. Then, a good quality after-oxidation film is formed by the thermal oxidation method around this gate structure. The reliability of the memory cell is greatly improved by the formation of this kind of after-oxidation film. That is to say, electrons stored in the floating gate by data-writing are surrounded by a potential barrier due to this after-oxidation film. The better this after-oxidation film is, the higher the barrier is, and electrons do not escape from the floating gate even if some degree of electric field is applied.

However, if the quality of this after-oxidation film is not sufficiently good due to some cause or other in the production process, the above-mentioned state cannot be established. At this time, when the control gate of a memory cell to which data has been Written is made ground potential Vss and a high potential is applied to the drain (this kind of state occurs at unselected memory cells whose drains are connected to the bit-line to which the drain of the selected memory cell is connected when writing), a high potential is applied between the floating gate and the drain. At such a time, a potential stress may be applied to a poor quality after-oxidation film and, in the worst case, electrons will escape from the floating gate. As a result, there is a risk that in a memory cell to Which data has once been written and whose threshold voltage Vthcell, viewed from the control gate, has risen, Vthcell may drop again due to the escape of electrons from the floating gate. In other words, data once written may be erased.

For this reason it is necessary to have a reliability test in order to study the data holding characteristic at the drain side of the memory cell. In the prior art, this test was carried out in the following order.

(1) Inject electrons to the floting gates of all memory cells.

(2) Measure Vccmax.

(3) Set one memory cell in the select condition, so that stress continues to be applied to the drains only of all other memory cells connected to the same bit line.

(4) Measure Vccmax again.

(5) Compare the Vccmax measured in (2) with that measured in (4).

Here, in (5), when both Vccmax are equal, it can be said that electrons have not escaped from the floating gate and so the after oxidation film has been formed in good condition.

However, the above test can only be applied to those memory cells connected to the selected bit-line. Consequently, in order &o apply stress to all the memory cells, it is necessary to carry out the above test on all bit-lines. In the case of the column address being n bits, the number of tests is $2^n$. Thus, if this kind of test is carried out on every single bit-line, it takes an extremely long time.

Therefore, in the prior art, in order to attempt to shorten the time required for the above testing, internal test functions are provided in memories. When carrying out the above reliability testing in order to check the data-holding characteristics, this internal test function controls the row decoder and the column decoder so that, by passing current through all the bit line selector transistors, the high potential for writing is simultaneously applied to the drains of all memory cells. This kind of function can be achieved with a circuit which generates a switch signal in order to switch between the reliability test and normal operation, a circuit to set all word-lines in the unselected state, and a circuit to pass current through all bit-line selector transistors.

FIG. 3 shows an example of a circuit for generating the switch signal for this internal test function. In the Figure, numeral 61 is one of the address input terminals. Between this address input terminal 61 and ground potential Vss, two P-channel MOS transistors 62 and 63 and one N-channel MOS transistor 64 are connected in series. The gate of transistor 62 is connected to series connection points of transistor 62 and transistor 63. Power source potential Vcc is supplied to the gates of transistors 63 and 64. Also, the input terminal of inverter 65 is connected to the series connection point of transistors 63 and 64. The input terminal of another inverter 66 is connected to the output terminal of inverter 65. In this kind of circuit, when a normal "1" level (Vcc) or "0" level (Vss) potential is applied to address input terminal 61, P-channel MOS transistor 63 becomes "off" and the potential of the input terminal of inverter 65 is set to "0" level by N-channel MOS transistor 64, which is "on". Because of this, the signal TEST which is output from inverter 66 becomes "0" level.

On the other hand, when a potential of more than Vcc+2Vthp (here, Vthp is the threshold voltage of the P-channel MOS transistor) is impressed on address input terminal 61, P-channel MOS transistor 63 comes "on" and the potential of the input terminal of inverter 65 becomes more than Vss. Thus, the signal TEST output from inverter 66 becomes "1" level.

FIG. 4 shows the composition of a 1 bit portion of the column address buffer circuit which enables the internal test function. Normally, this column address buffer circuit forms address signals Ai* and $\overline{Ai}$ of the same phase as and the opposite phase to the column address signal Ai which is input to it, and outputs them to the column decoder. However, in the case of a reliabilitY test in which the signal TEST is made "1" level, whatever the column address signal which may be input, it is necessary that the decoder outputs of the column decoder should be controlled so that they are all "1" level. Thus, in this column address buffer circuit, as shown in the Figure, a NOR gate 72 is inserted in the stage before inverter 71 which inverts input address signal Ai, and the above-mentioned switch signal TEST is input to this NOR gate 72. At the same time, NOR gate 75 is inserted between two inverters 73 and 74 which are connected in a vertical column. In this column, input address signal Ai is inverted twice, so that the above-mentioned switch signal TEST is also input to this NOR gate 75. In this kind of column address buffer circuit, when there is normal operation in which the above signal TEST is made "0" level, since NOR gates 72 and 75 operate as simple inverters, address signals Ai* and $\overline{Ai}$ of the same phase as and the opposite phase to, respectively, that of the input column address signal Ai are formed. On the other hand, in the case of the reliability test, in which the above signal TEST is made "1" level, since the outputs of NOR gates 72 and 75 are made "0" level without any relation to the input column address signal Ai, both output column address signals Ai* and $\overline{Ai}$ are made "1" level.

FIG. 5 shows the composition of a pre-decoder which drives one of the word-lines of the row decoder in order to achieve the internal test function. Normally, this pre-decoder selects and drives the word-line only in accordance with multi-bit row address signals which are input. However, in the case of a reliability test in which the signal TEST is made "1" level, whatever the row address signal which may be input, it is necessary that the word-line is not driven in response to this. That is to say, it is necessary to arrange matters so that a "0" level signal is output to the word-line. Therefore, in this pre-decoder, the above switch signal TEST is input via inverter 82 to one of the input terminals of NAND gate 81 to which a multi-bit row address signal is input. This multi-bit row address signal is output from a row address buffer which is not illustrated. Thus, the word line is driven in accordance with the output of inverter 83 which inverts the output signal of NAND gate 81. In this kind of pre-decoder, in the case of a reliability test in which the above signal TEST is made "1" level, the output signal of inverter 82 is made "0" level. Thus, the output signal of NAND gate 81 is made "1" level without any dependence on the row address signal. Furthermore, the output signal of inverter 83 is made "0" level. For this reason, the word-line is put into the unselected condition regardless of the row address signal which is input.

By using this kind of internal test function, all column selector transistors 51 and 52 !n the circuit in FIG. 2 become "on". At this time, a high potential Vpp for writing is applied to the gate of "write" transistor 55. Since this transistor 55 is "on", all bit-lines BL1 and BL2 are set at a potential close to this high potential Vpp. On the other hand, all word-lines WL1 and WL2 are in the unselected condition. That is to say, the potential of each is made Vss. By this means, a potential stress is applied to the drains of all memory cells M simultaneously.

By using this kind of internal test function, $\frac{1}{2^n}$ of the prior art time is sufficient for applying stress to memory cell drains and so a great reduction in the test time can be achieved.

However, in an EPROM, when writing data, a high potential is applied to the control gates and drains of the selected memory cells and writing is carried out while a cell current is flowing. The equivalent circuit when this data-writing is being carried out is shown in FIG. 6. When data is being written, a high potential Vpp for writing is applied to the gate of "write" transIstor 55 and to the gate of bit-line selector transistor 51 (or 52).

The high potential Vpp for writing is also applied to the drain of the "write" transistor and the control gate of memory cell M. The load characteristic of transistors 55 and 51 (or 52) at this time and the current characteristic of memory cell M, which is in the selected condition, are shown in FIG. 7. In the Figure, curve A is the load characteristic and curve B is the current characteristic. The bit line BL potential when writing data is the potential vA at the point where curve A and curve B intersect. That is to say, when writing data normally, the potential of bit-line BL is VA.

However, when using an internal test function such as the above, the situation will change. In the case of a reliability test, all word-lines WL are made "0" level (Vss). Because of this, the high potential Vpp for writing is not applied to the control gate of memory cell M but it is made ground potential Vss instead. For this reason, a cell current does not flow in memory cell M in the equivalent circuit in FIG. 6. Thus, a potential VB which is lower than Vpp by just the threshold voltage Vth of N-channel MOS transistor ($VB = Vpp - Vth$) is applied to bit-line BL. As is clear from FIG. 7, $VB > VA$. That is to say, if an internal test function is used when carrying out the reliability test, a higher potential than when normal data-writing is applied to the drains of the memory cells, and thus a greater stress is applied to the drains. Because of this, data may escape from memory cells which otherwise would not let data escape or, in the worst case, breakdown of the element may occur. The characteristics of memory cells can not be accurately measured by such a method which applies a stress which is different from that of normal operation.

There is a problem in that the characteristics of memory cells cannot be accurately measured by the internal test functions provided by prior art in memories with the aim of shortening the time required for reliability testing to find the data-holding characteristics at the drain sides of memory cells.

SUMMARY OF THE INVENTION

An object of this invention is to provide a non-volatile semiconductor memory which can measure the data-holding characteristics of memory cells accurately and quickly.

This invention provides a non-volatile semiconductor memory having a first node and a second node, the second node having a ground potential, comprising: a plurality of non-volatile memory cells each having a drain and a threshold potential, the cells for storing data written at a predetermined normal writing voltage; a plurality of bit lines, each memory cell being connected to one of the bit lines, each of said bit lines transferring data to and from associated memory cells; and a circuit connected to the bit lines for simultaneously testing each of the memory cells associated with the plurality of bit lines at the predetermined normal writing voltage to detect changes in the threshold potential of each memory cell.

In the non volatile semiconductor memory of this invention, when testing, a specified potential is applied between one end of each memory cell and its corresponding floating gate, and a different "write" potential is applied to the respective gates of a second selector transistor and a dummy cell by setting a plurality of first selector transistors in a select condition and each memory cell in a non select condition. When writing normal data, the potential of the first node is set to the same potential as the "write" potential by passing a cell current corresponding to that flowing in the memory cell through the dummy cell.

DETAILED DESCRIPTION OF THE PREFERRED EMBODIMENT

Figure 8:
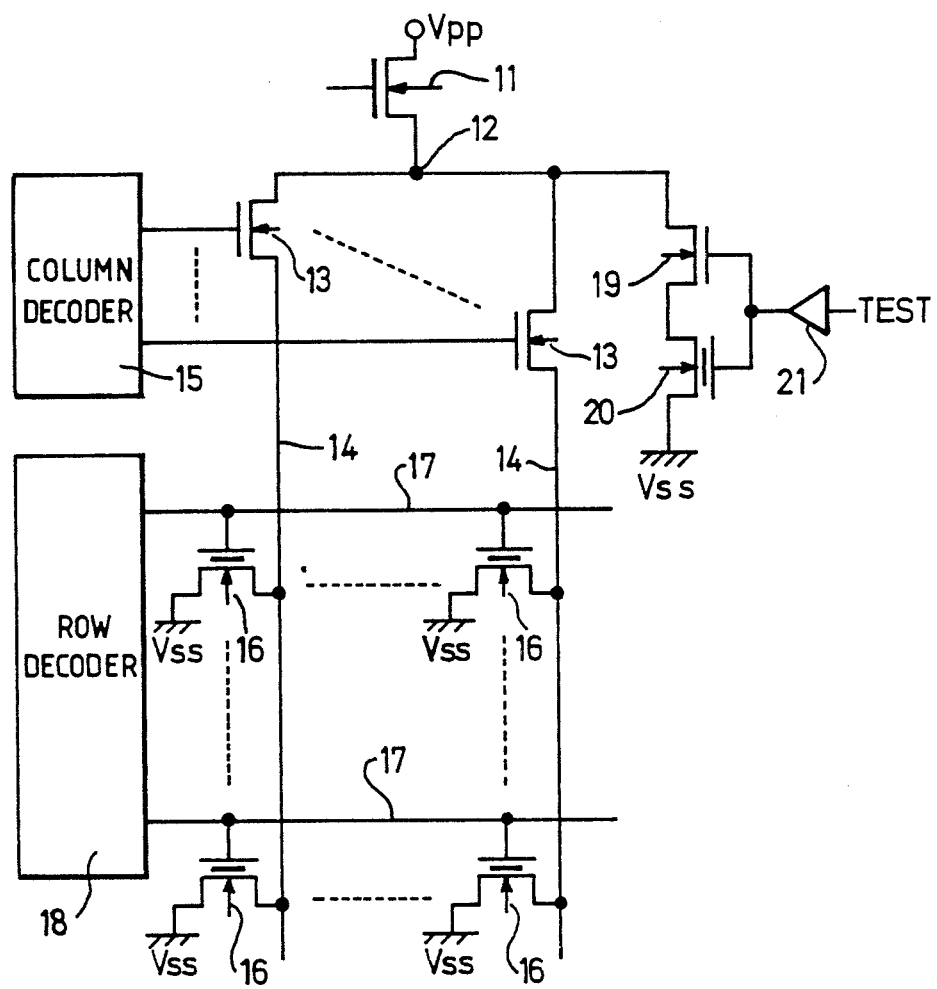
FIG. 8 is a circuit diagram showing the composition of an embodiment of this invention.

An embodiment of this invention is described below with reference to drawings. FIG. 8 is a circuit diagram showing the composition of a non volatile semiconductor memory relating to this invention. In the Figure, numeral 11 is a "data write" transistor. The drain of this transistor 11 is connected to high potential Vpp for data-writing and its source is connected to node 12. The device is designed so that an output signal from a data-writing circuit (not illustrated) is supplied to the gate of "data write" transistor 11. When writing data, this signal is made high potential Vpp.

Each drain of a number of bit line selector transistors 13 is connected in common to node 12. A separate bit-line 14 is connected to each of the respective sources of these bit-line selector transistors 13. Moreover, the device is designed so that an output signal from column decoder 15 can be supplied to each gate.

The drains of a number of memory cells 16, composed of non-volatile transistors, are each connected to a bit-line 14. The control gates of these memory cells 16 are connected to word-lines 17 and their sources are connected in common to ground potential Vss. Also, the device is designed so that a decoder signal from row decoder 18 can be supplied to each word-line 17.

Moreover, the drain of MOS transistor 19 is connected to node 12. The drain of a dummy cell 20, which is composed of a non-volatile transistor having the same construction and element area as a memory cell 16, is connected to the source of transistor 19. The source of dummy cell 20 is connected to ground potential Vss. The gate of transistor 19 and the control gate of dummy cell 20 are connected together, and the device is designed so that the output signal from a voltage converter circuit 21 is supplied to this connection point.

Figure 3:
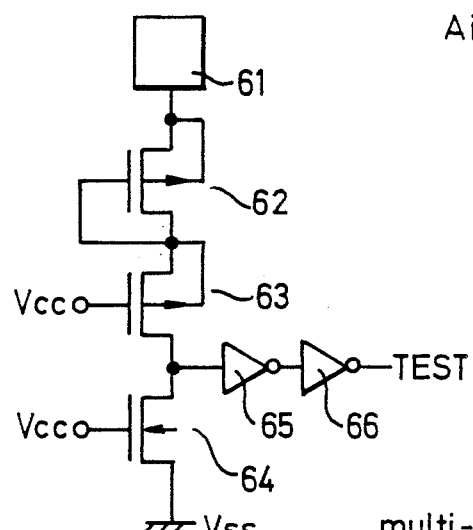
FIGS. 3, 4, and 5 are each circuit diagrams of circuits provided both in prior art devices and in this embodiment.
Figure 4:
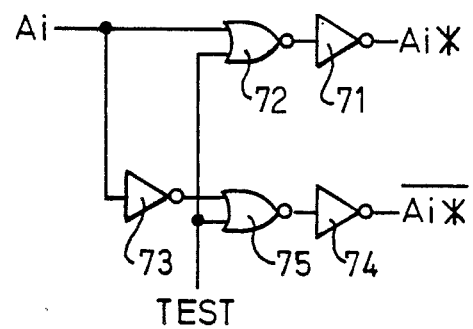
Figure 5:
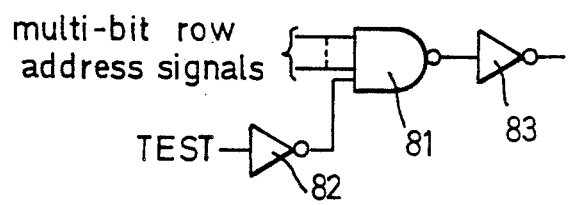
Figure 6:
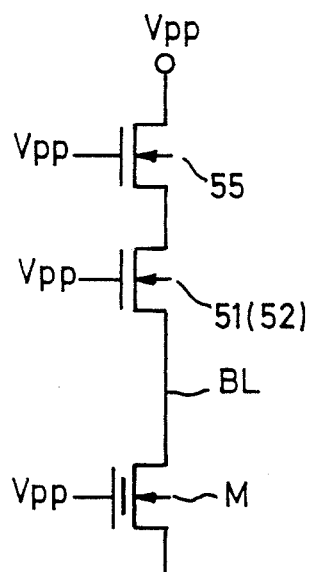
FIG. 6 is an equivalent circuit dIagram of a prior art device.

Furthermore, an internal test circuit composed of the circuits shown in FIGS. 3 to 5 is also included in the memory of this embodiment. A switch signal TEST generated by the circuit shown in FIG. 3 is supplied to voltage converter circuit 21. This voltage converter circuit 2 supplies Vcc type signal TEST to transistors 19 and 20 by level shifting the signal to Vpp type. In this kind of composition, when carrying out a reliability test to find the data-holding characteristics of memory cells 16, all bit-line selector transistors are put "on" by the output of column decoder 15 in the same way as in the prior art by the internal test function.

Figure 1:
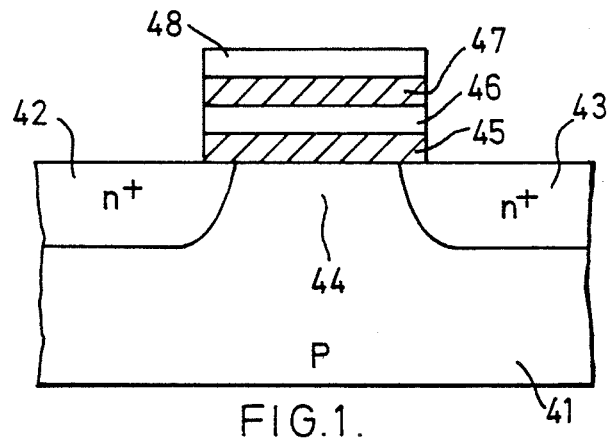
FIG. 1 is a cross-section showing the element construction of non-volatile transistor.
Figure 2:
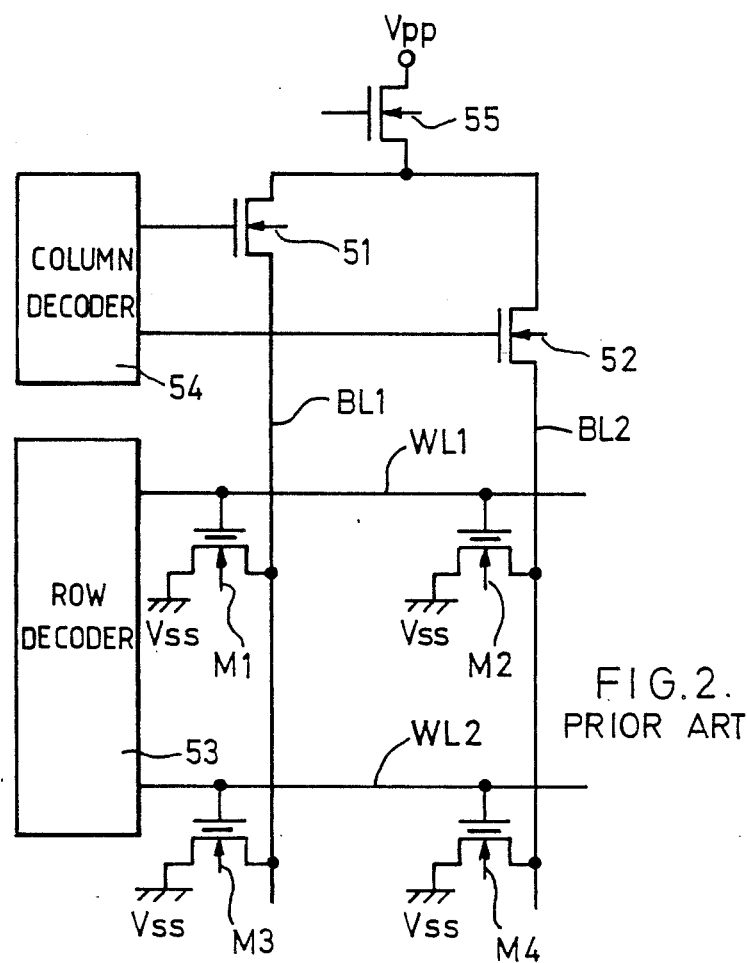
FIG. 2 is a circuit diagram of a prior art device.
Figure 7:
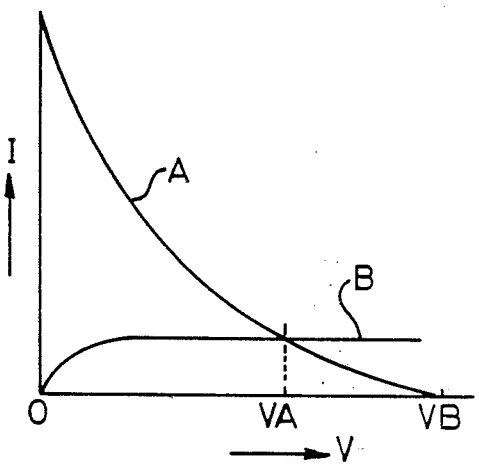
FIG. 7 is a voltage characteristics diagram of non-volatile semiconductor devices.

On the other hand, when this reliability test is carried out, switch signal TEST is made "1" level (Vcc) by the circuit in FIG. 3. The "1" level of this signal TEST is converted to Vpp level by voltage converter circuit 21. Consequently, potential Vpp, which is equivalent to the high potential for writing, is applied to both the gate of transistor 19 and the control gate of dummy cell 20. Since dummy cell 20 is composed of a non volatile transistor having the same construction and element area as a memory cell 16, the same cell current flows in dummy cell 20 as that which flows in memory cell 16 during normal data-writing. A potential is generated at node 12 by the flow of such a current, which is equivalent to the potential when data is being written in memory cell 16. At this time, since all bit line selector transistors 13 are "on", a potential equivalent to potential VA in FIG. 7 is applied to the drain of each memory cell 16. As a result, even using the internal test function when carrying out reliability testing, the same potential as that of normal data writing can be applied to the drains of memory cells 16. Consequently, the stress applied to each drain is also the same as that during normal data writing, and the characteristics of memory cells 16 can be measured under the same conditions as when operating normally. For this reason, there is no risk of mistaking bad items for good items or damaging elements by over stress, as in the prior art. Thus, measurement can be carried out extremely accurately. Moreover, since the device is designed so that stress is applied to all memory cell drains simultaneously, the time required for characteristic measurement can be made as short as that in the case of the all-bit line device shown in FIG. 2.

Figure 9:
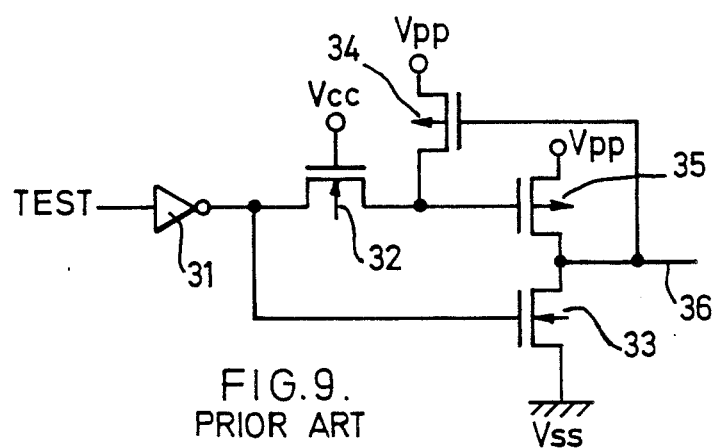
FIG. 9 is a circuit diagram showing a known voltage converter circuit used in the embodiment of FIG. 8.

FIG. 9 is a circuit diagram showing an example of a practical composition of voltage converter circuit 21. This circuit is composed of inverter 31, N-channel MOS transistors 32 and 33 and P-channel MOS transistors 34 and 35. Circuit 21 is a well known voltage converter circuit which outputs the level converted signal TEST from output terminal 36. This circuit has such properties as a broad power source margin and low current consumption, and it can be used even in other types of devices. To explain its operation simply, when switch signal TEST is made "1" level and the output signal of inverter 31 becomes "0" level, a current flows from high potential Vpp via transistors 34 and 32. The gate potential of transistor 35 falls due to this current, and transistor 35 remains "on" until the gate potential reaches Vpp−Vthp (here, Vthp is the threshold voltage of a P-channel MOS transistor 35). When transistor 35 is "on", output terminal 36 is charged by high potential Vpp. Then, When the potential of output terminals 36 reaches Vpp−Vthp, transistor 34 is turned "off". At this time, transistor 35 is also turned "off" and the current outflow route from Vpp is lost. On the other hand, when switch signal TEST is made "0" level, the output signal of inverter 31 becomes "1" level and output terminal 36 is discharged to Vss by transistor 33 being turned "on".

By using this invention as explained above, a non-volatile semiconductor memory can be provided which can measure the data-holding characteristics of memory cells both accurately and rapidly.

Various modifications and variations could be made to the invention without departing from the scope of the invention.

What is claimed is:

1. A non-volatile semiconductor memory having a first node and a second node, the second node having a ground potential, comprising:
    a plurality of non-volatile memory cells each having a drain, a floating gate, a control gate, and a threshold potential, wherein data is written into a selected cell when the drain potential of the selected cell is at a predetermined normal writing voltage and a select signal is applied to the control gate of the selected cell;
    a plurality of bit lines, each memory cell being connected between one of the bit lines and said second node, each of said bit lines transferring data to and from associated memory cells;
    write voltage means for generating a first signal having the predetermined normal writing voltage and for supplying the first signal to the drain of at least one non-volatile memory cell when data is written into said at least one non-volatile memory cell;
    test voltage means for generating a second signal having a voltage equivalent to the predetermined normal writing voltage and for supplying the second signal to the drain of each non-volatile memory cell to simultaneously test all of the memory cells, said test voltage means including:
    circuit means, connected to the bit lines, for simultaneously testing all of the memory cells by supplying to the drain of each memory cell said second signal to detect changes in the threshold potential of each memory cell,
    said circuit means including a select transistor and a dummy cell, the select transistor of the circuit means and the dummy cell being connected in series between the first node and the second node.

2. The non-volatile semiconductor memory of claim 1 wherein each respective bit line is connected to the first node through a corresponding one of a plurality of select transistors.

3. The non-volatile semiconductor memory of claim 1 wherein the test voltage means is supplied with a signal having an input voltage, wherein a signal of predetermined voltage higher than the input voltage is applied to a control gate electrode of said selected non-volatile memory cell when data is written into said selected non-volatile memory cell, and wherein the test voltage means includes voltage converter means for converting the input voltage to the predetermined voltage.

* * * * *

UNITED STATES PATENT AND TRADEMARK OFFICE
CERTIFICATE OF CORRECTION

PATENT NO.  : 4,956,816
DATED       : September 11, 1990
INVENTOR(S) : Shigeru Atsumi et al.

It is certified that error appears in the above-identified patent and that said Letters Patent is hereby corrected as shown below:

In the Abstract, line 4, change "cells" to --cells,--.

In the Abstract, line 5, change "cells," to --cells--.

Signed and Sealed this

Thirtieth Day of March, 1993

Attest:

STEPHEN G. KUNIN

Attesting Officer         Acting Commissioner of Patents and Trademarks